(12) United States Patent
Yasuda et al.

(10) Patent No.: US 7,265,604 B2
(45) Date of Patent: Sep. 4, 2007

(54) HIGH-FREQUENCY SWITCH CIRCUIT ARRANGEMENT

(75) Inventors: Eiji Yasuda, Takatsuki (JP); Tadayoshi Nakatsuka, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 5 days.

(21) Appl. No.: 11/285,152

(22) Filed: Nov. 23, 2005

(65) Prior Publication Data
US 2006/0114051 A1 Jun. 1, 2006

(30) Foreign Application Priority Data
Nov. 26, 2004 (JP) ............................ P2004-342439

(51) Int. Cl.
*H03K 17/785* (2006.01)
(52) U.S. Cl. .................... 327/430; 327/427; 333/81 R; 333/101
(58) Field of Classification Search ...................... None
See application file for complete search history.

(56) References Cited

U.S. PATENT DOCUMENTS 5,039,873 A * 8/1991 Sasaki ......................... 327/237
5,731,607 A * 3/1998 Kohama ...................... 257/275
5,774,792 A * 6/1998 Tanaka et al. ................. 455/78
5,777,530 A * 7/1998 Nakatuka ..................... 333/104
5,969,560 A * 10/1999 Kohama et al. ............. 327/308
6,693,498 B1 * 2/2004 Sasabata et al. ............. 333/103

FOREIGN PATENT DOCUMENTS

JP 10-335582 A 12/1998
JP 2003-100893 4/2003

* cited by examiner

*Primary Examiner*—Kenneth B. Wells
*Assistant Examiner*—An T. Luu
(74) *Attorney, Agent, or Firm*—McDermott Will & Emery LLP

(57) ABSTRACT

A high-frequency switch circuit arrangement. A plurality of stages (for example, two stages) of capacitative elements connected in series (C11 and C12, C21 and C22) are used in a shunt path of a high-frequency component. If a surge voltage is applied, the voltage that each capacitative element should bear decreases in inverse proportion to the number of the connection stages. Consequently, the surge resistance of the capacitative element is improved. The capacitative elements connected in series can be manufactured using the usual manufacturing process of compound semiconductor devices and if the structure of the invention is adopted, a protective diode need not be provided. As the capacity is made common and the device structure is designed, the high-frequency switch circuit arrangement can be further made compact, etc.

5 Claims, 8 Drawing Sheets

HIGH-FREQUENCY SWITCH CIRCUIT ARRANGEMENT

BACKGROUND OF THE INVENTION

1. Field of the Invention

This invention relates to a high-frequency switch circuit arrangement and in particular to an art of improving resistance to a surge of a high-frequency switch circuit arrangement.

2. Description of the Related Art

A mobile communication terminal such as a mobile telephone uses GHz-band radio waves at the communication time. At the time, field effect transistors (FETS) using gallium arsenide (GaAs) excellent in high frequency characteristics are used in an antenna switch circuit, a transmission-reception. switch circuit, etc., as switching elements.

FIG. 8 is a circuit diagram to show the configuration of a high-frequency SPDT (Single-Pole Double-Throw) switch using GaAs FETs as switching elements.

The high-frequency SPDT switch has a function of selectively switching the output path of an input high-frequency signal. As shown in the figure, a first signal terminal RF1 is placed on the input side and a second signal terminal RF2 and a third signal terminal RF3 are placed on the output side. The high-frequency signal input through RF1 is output to one of RF2 and RF3 (the switch input/output may be made opposite).

A first field effect transistor stage FET1 of a switch circuit for switching the high-frequency signal path is provided between the first signal terminal (RF1) and the second signal terminal (RF2). Likewise, a second field effect transistor stage FET2 is provided between the first signal terminal (RF1) and the third signal terminal (RF3). (In the description to follow, it is assumed that the field effect transistor stage means a switch circuit using a field effect transistor as a switching element.)

Turning on/off both the field effect transistor stages is controlled by control signal inputs CTL1 and CTL2, whereby the signal terminal RF1 is electrically connected to one of RF2 and RF3.

On the other hand, the FET in the off state is equivalent to capacity component (capacitor) and assuming that the portion between RF1 and RF2 is on and the portion between RF1 and RF3 is off, the high-frequency signal from RF1 leaks to the side of RF3 through the equivalent capacity component when the switching FET2 is off. To draw the signal into ground (GND) with the FET in the on state, a fourth field effect transistor stage FET4 and a capacitive element C1 for cutting DC is placed between the third signal terminal RF3 and the ground terminal GND, forming a shunt circuit 1; likewise, a third field effect transistor stage FET3 and a capacitive element C2 for cutting DC is placed between the second signal terminal RF2 and the ground terminal GND, forming a shunt circuit 2.

The shunt circuit 1, 2 serves a function of short-circuiting the path in an alternating current manner and causing unnecessary high-frequency component to escape to the high-frequency ground (ground potential). Accordingly, the isolation characteristic between the contacts (FR2 and FR3) in the high-frequency switch circuit arrangement is kept good.

A capacitive element always exists in a high-frequency switch circuit arrangement containing a shunt circuit like the high-frequency SPDT switch described above. It is desirable that the capacitive element should be manufactured on a single GaAs chip and be integrated as MMIC (Monolithic Microwave IC) from the viewpoint of reducing the number of external parts.

However, in the MIM (Metal Insulator Metal) capacity manufactured on the GaAs substrate, the insulating film between upper and lower electrodes is very thin and therefore the capacitive element often is at the lowest electrostatic breakdown voltage in the high-frequency switch circuit and needs to be handled with extreme care. That is, the element having the lowest electrostatic breakdown voltage dominates the electrostatic breakdown voltage of the whole high-frequency switch circuit arrangement and therefore it becomes important to improve the electrostatic breakdown voltage of the capacitive element to improve resistance to a surge of the high-frequency switch circuit arrangement.

The simplest method for improving the electrostatic breakdown voltage of the capacitive element as described above is a method of using a high dielectric material for the capacitative element and widening the space between upper and lower electrodes for improving electrostatic resistance of the capacitative element or a method of connecting a protective element in parallel with an element having low electrostatic breakdown voltage (in this case, capacitative element), thereby improving resistance to a surge as the whole high-frequency switch circuit arrangement.

For example, the method of using a high dielectric material for the capacitative element is disclosed in JP-A-10-335582. The method of connecting a protective element in parallel with an element having low electrostatic breakdown voltage is disclosed in JP-A-2003-100893.

However, to use the methods described above, the following problems may occur:

To manufacture an element using a high dielectric material in MMIC, the forming process becomes complicated and the number of masks for capacitative element formation and the total number of steps are increased.

To attempt to create without increasing the number of steps, the high dielectric material is also formed as interlayer dielectric and thus a function problem as interlayer dielectric may occur, namely, an increase in parasitic components may introduce a problem.

On the other hand, in the method of adding a protective diode as a protective element in parallel with a protected element for improving the electrostatic breakdown voltage, it is actually difficult to manufacturer an element as a protective diode namely, a diode having high electrostatic breakdown resistance voltage on the GaAs substrate, and the manufacturing process becomes complicated. Further, connecting a protective diode may lead to addition of parasitic capacity and may cause the high-frequency characteristic to be degraded.

SUMMARY OF THE INVENTION

It is therefore an object of the invention to provide a high-frequency switch circuit arrangement capable of improving resistance to a surge as the whole high-frequency switch circuit arrangement without changing the steps of the manufacturing process or adding any step.

According to the invention, there is provided a high-frequency switch circuit arrangement including an input terminal for inputting a high-frequency signal; an output terminal for outputting the input high-frequency signal; a first field effect transistor being connected between the input terminal and the output terminal; a second field effect transistor having a drain connected to the input terminal so as to enter a conduction state when the first field effect transistor is in a non-conduction state; and two stages of capacitative elements being connected in series between a source of the second field effect transistor and a ground terminal.

According to the configuration, capacitative elements (also functioning as DC cut capacity) of components of a shunt circuit of a high-frequency component are connected in series at least at two stages, whereby if a surge voltage is applied, the voltage that each capacitative element should bear decreases in inverse proportion to the number of the connection stages. For example, if two stages of capacitative elements are connected in series, the voltage applied to one stage of capacitative element becomes about a half as compared with the case where one stage of capacitative element is used as in the related art. Accordingly, resistance to a surge as the whole high-frequency switch circuit can be improved about twice. Capacitative elements connected in series can be manufactured using the usual manufacturing process of compound semiconductor devices and if the structure of the invention is adopted, it is not necessary to provide a protective diode. Therefore, resistance to a surge as the whole high-frequency switch circuit arrangement can be efficiently improved without changing the steps of the manufacturing process or adding any step.

According to the invention, there is provided a high-frequency switch circuit arrangement including first to third input/output terminals; a first field effect transistor intervening in a first signal path connecting the first input/output terminal and the second input/output terminal; a second field effect transistor intervening in a second signal path connecting the first input/output terminal and the third input/output terminal; a third field effect transistor having a drain connected to a signal path between the first field effect transistor and the second input/output terminal, the third field effect transistor being turned on when the first field effect transistor is off; a fourth field effect transistor having a drain connected to a signal path between the first field effect transistor and the third input/output terminal, the fourth field effect transistor being turned on when the second field effect transistor is off; first and second capacitative elements being connected in series between a source of the second field effect transistor and a ground potential; and third and fourth capacitative elements being connected in series between a source of the fourth field effect transistor and the ground potential.

In the high-frequency switch circuit arrangement that can selectively output the input high-frequency signal to the first and second signal paths, the shunt circuit made up of the third field effect transistor and the first and second capacitative elements is connected to the first signal path and likewise the shunt circuit made up of the fourth field effect transistor and the third and fourth capacitative elements is connected to the second signal path. The shunt circuit containing two stages of capacitative elements is connected for each signal path, whereby the electrostatic breakdown resistance amount of the capacitative elements is improved for all signal paths and the weak point when the capacitative elements are integrated into MMIC is overcome.

The high-frequency switch circuit arrangement of the invention has a connection point of connecting the sources of the second and fourth field effect transistors, and the first and second capacitative elements and the third and fourth capacitative elements are common.

That is, the high-frequency switch circuit arrangement includes the first to third input/output terminals; the first field effect transistor intervening in the first signal path connecting the first input/output terminal and the second input/output terminal; the second field effect transistor intervening in the second signal path connecting the first input/output terminal and the third input/output terminal; the third field effect transistor having the drain connected to the signal path between the first field effect transistor and the second input/output terminal, the third field effect transistor being turned on when the first field effect transistor is off; the fourth field effect transistor having the drain connected to the signal path between the first field effect transistor and the third input/output terminal, the fourth field effect transistor being turned on when the second field effect transistor is off; and the first and second capacitative elements being connected in series between the common connection point of connecting the sources of the second and fourth field effect transistors and the ground potential.

To form the shunt circuit for the first and second signal paths, the first and second capacitative elements are used common. Accordingly, the number of the capacitative elements can be decreased and the capacitative element occupation area when the capacitative elements are put into MMIC can be reduced. In an integrated circuit, the capacitative element tends to occupy a large area, which is one factor of hindering miniaturization of the chip size. Thus, the merit in decreasing the number of the capacitative elements is large.

The high-frequency switch circuit arrangement of the invention is the high-frequency switch circuit arrangement as claimed in any of claims 1 to 3 wherein the capacitative elements or the first and second capacitative elements are implemented as an MIM (metal insulator metal) capacitor including a lower electrode created on a semiconductor substrate and first and second upper electrodes formed apart on a dielectric layer via the dielectric layer formed on the lower electrode, wherein the source of the second field effect transistor is connected to the first upper electrode, wherein the second upper electrode is connected to the ground terminal, and wherein one stage of a capacitative element formed between the first upper electrode and the lower electrode and one stage of a capacitative element formed between the lower electrode and the second upper electrode make up two stages of capacitative elements connected in series.

Capacitative elements put into MMIC can be manufactured reasonably and efficiently using the usual manufacturing process technology of compound semiconductor ICs simply by changing the layout. The common lower electrode is used common to the two stages of the capacitative elements and the drawing contact part is not required for the common lower electrode and the occupation area can be reduced accordingly.

The high-frequency switch circuit arrangement of the invention includes first to third input/output terminals; a first field effect transistor intervening in a first signal path connecting the first input/output terminal and the second input/output terminal; a second field effect transistor intervening in a second signal path connecting the first input/output terminal and the third input/output terminal; a third field effect transistor having a drain connected to a signal path between the first field effect transistor and the second input/output terminal, the third field effect transistor being turned on when the first field effect transistor is off; a fourth field effect transistor having a drain connected to a signal path between the first field effect transistor and the third input/output terminal, the fourth field effect transistor being turned on when the second field effect transistor is off; a first capacitative element being connected at one end to a source of the second field effect transistor; a second capactatative element being connected at one end to a source of the fourth field effect transistor; and a third capacitative element being connected between a common connection point of opposite ends of the first and second capacitative elements and a ground potential.

The third capacitative element is used as common capacitative element to form the shunt circuit for the first and second signal paths. As some capacitative elements are made common, the capacitative element occupation area can be reduced. Assuming the case where the number of signal paths increases, only one stage of the third capacitative element exists between the common connection point of common connecting one ends of the capacitative elements on the shunt field effect transistor side and the ground potential in the shunt circuit connected to the signal path in the off state, and the impedance between the common connection point and the ground potential is low as compared with the case where two stages of capacitative elements intervene (the two stages of capacitative elements are made common to all signal paths). Therefore, unnecessary high-frequency signal component can be caused effectively to escape to the ground potential through the shunt circuit. Consequently, such a situation wherein the high-frequency signal component flowing from one shunt path toward the ground potential is not absorbed in the ground potential and is routed to the shunt circuit relative to another off signal path is prevented and therefore degradation of isolation between the shunt circuits relative to off signal paths can be prevented.

In the high-frequency switch circuit arrangement of the invention, the first to third capacitative elements are implemented as an MIM capacitor (Metal Insulator Metal) formed on a semiconductor substrate, and the MIM capacitor includes a common lower electrode formed on the semiconductor substrate, a dielectric layer formed on the common lower electrode, and first to third upper electrodes formed apart each other on the dielectric layer and has a structure wherein the sources of the field effect transistors are connected to the first and second upper electrodes and the third upper electrode is connected to the ground potential, wherein the common lower electrode, the dielectric layer, and the first upper electrode form the first capacitative element, the common lower electrode, the dielectric layer, and the second upper electrode form the second capacitative element, and the common lower electrode, the dielectric layer, and the third upper electrode form the third capacitative element.

Capacitative elements put into MMIC can be manufactured efficiently using the usual manufacturing process technology of compound semiconductor ICs. The common lower electrode is used common to the two stages of the capacitative elements and the need for the drawing contact part is eliminated for the common lower electrode and the occupation area can be reduced accordingly.

In another form of the high-frequency switch circuit arrangement of the invention, the first to third capacitative elements are implemented as an MIM (Metal Insulator Metal) capacitor formed on a semiconductor substrate, and the MIM capacitor includes a first capacitor electrode formed on the semiconductor substrate, a first dielectric layer provided on the first capacitor electrode, a second common capacitor electrode provided on the first dielectric layer, a second dielectric layer formed on the second common capacitor electrode, and third and fourth capacitor electrodes formed apart each other on the second dielectric layer and has a structure wherein the sources of the field effect transistors are connected to the third and fourth capacitor electrodes and the first capacitor electrode is connected to the ground potential, the third and fourth capacitor electrodes, the second dielectric layer, and the second common capacitor electrode form the first and second capacitative elements, and the first capacitor electrode, the first dielectric layer, and the second common capacitor electrode form the third capacitative element.

Using a multilayer interconnection technique, the capacitative element required for a shunt circuit is formed efficiently and compactly. The second common capacitor electrode functions as the lower electrode of the third and fourth capacitor electrodes and also functions as the upper electrode of the first capacitor electrode. The drawing contact part is not required for the second common capacitor electrode and the capacitative element can be miniaturized. The opposed area of the first capacitor electrode of the lowest layer to the second common capacitor electrode can be taken wide and the capacity of the third capacitative element can be increased. Therefore, the impedance between the common connection point of common connecting one ends of the capacitative elements on the shunt field effect transistor side and the ground potential in the shunt circuit connected to the signal path in the off state can be furthermore lessened. Consequently, such a situation wherein the high-frequency signal component flowing from one shunt path toward the ground potential is not absorbed in the ground potential and is routed to the shunt circuit relative to another off signal path is effectively prevented and the degradation prevention effect of isolation between the shunt circuits relative to off signal paths is enhanced.

In another form of the high-frequency switch circuit arrangement of the invention, the semiconductor substrate is formed with a via hole and a ground electrode covering the inner surface of the via hole and connected to the ground potential is formed and the ground electrode and the first capacitor electrode are connected through the via hole.

The method of connecting the first capacitor electrode to the ground potential through a via hole is adopted, whereby the fear of adding the inductance component caused by bonding wire, etc., is eliminated and AC impedance is furthermore lessened. Therefore, the degradation prevention effect of isolation between the shunt circuits relative to off signal paths is furthermore enhanced.

In another form of the high-frequency switch circuit arrangement of the invention, the high-frequency switch circuit arrangement is an mPnT (m-Pole n-Throw where m and n are each a positive integer) switch circuit arrangement having an arbitrary number of input/output terminals.

The high-frequency switch circuit arrangement of the invention is rich in expandability and if the number of input/output terminals increases, the high-frequency switch circuit arrangement can handle it easily.

The high-frequency switch circuit arrangement of the invention uses a plurality of field effect transistors connected in series as the field effect transistor intervening in each signal path.

To enhance the AC impedance of the signal path in the off state, a plurality of field effect transistors can also be cascaded for use.

In another form of the high-frequency switch circuit arrangement of the invention, a multigate field effect transistor is used as the field effect transistor intervening in each signals path.

A multigate field effect transistor can also be used instead of using a plurality of field effect transistors In another form of the high-frequency switch circuit arrangement of the invention, the source and the drain of the field effect transistor are symmetric.

In the field effect transistor as a switch element, the potential relationship changes and the source and the drain may be replaced with each other and therefore the fact is clarified by way of precaution.

The mobile communication terminal of the invention is a mobile communication terminal installing any of the high-frequency switch circuit arrangements described above.

The mobile communication terminal represented by a mobile telephone terminal uses a high-frequency switch circuit arrangement as an analog front end duplexer or an antenna changeover switch for antenna diversity, etc. The high-frequency switch circuit arrangement of the invention is appropriately put into MMIC and is small-sized and has high surge resistance, so that it can also be installed in a mobile communication terminal used in various environments with safety without any problems.

According to the invention, the capacitative elements of the components of a shunt path of a high-frequency component are connected in series at least at two stages, whereby if a surge voltage is applied, the voltage that each capacitative element should bear decreases in inverse proportion to the number of the connection stages and consequently the surge resistance of the capacitative element can be increased in proportion to the number of the connection stages.

If capacitative elements are integrated as MMIC, the insulating film is thin and thus the electrostatic breakdown resistance amount is low. However, according to the invention, the electrostatic breakdown resistance amount can be effectively increased without changing the manufacturing process and without adding an extra protective element. Accordingly, the reliability of the high-frequency switch circuit arrangement is improved.

The capacitative elements used with the shunt circuit are made common, whereby the number of elements reduces and the capacitative element occupation area when the capacitative elements are put into MMIC can be decreased. In an integrated circuit, the capacitative element tends to occupy a large area, which is one factor of hindering miniaturization of the chip size. Thus, the merit in decreasing the number of the capacitative elements is large.

Capacitative elements put into MMIC can be manufactured reasonably and efficiently using the usual manufacturing process technology of compound semiconductor ICs. The electrodes are made common, whereby the need for the drawing contact part is eliminated and the occupation area can be reduced.

Only the capacitative element on the ground potential side is made common, whereby such a situation wherein the high-frequency signal component flowing from one shunt path toward the ground potential is not absorbed in the ground potential and is routed to the shunt circuit relative to another off signal path is prevented more effectively and the degradation prevention effect of isolation between the shunt circuits relative to off signal paths is enhanced.

Using the multilayer interconnection technique, the capacitative element required for a shunt circuit can be formed efficiently and compactly.

The structure wherein the capacitor electrode is connected to the ground potential through a via hole is adopted, whereby the fear of adding the inductance component caused by bonding wire, etc., is eliminated and AC impedance is furthermore lessened and therefore the degradation prevention effect of isolation between the shunt circuits relative to off signal paths can be furthermore enhanced.

The high-frequency switch circuit arrangement of the invention is appropriately put into MMIC and is small-sized and has high surge resistance, so that it can also be installed in a mobile communication terminal used in various environments with safety without any problems.

DESCRIPTION OF THE PREFERRED EMBODIMENTS

Referring now to the accompanying drawings, there are shown preferred embodiments of the invention.

First Embodiment

Figure 1:
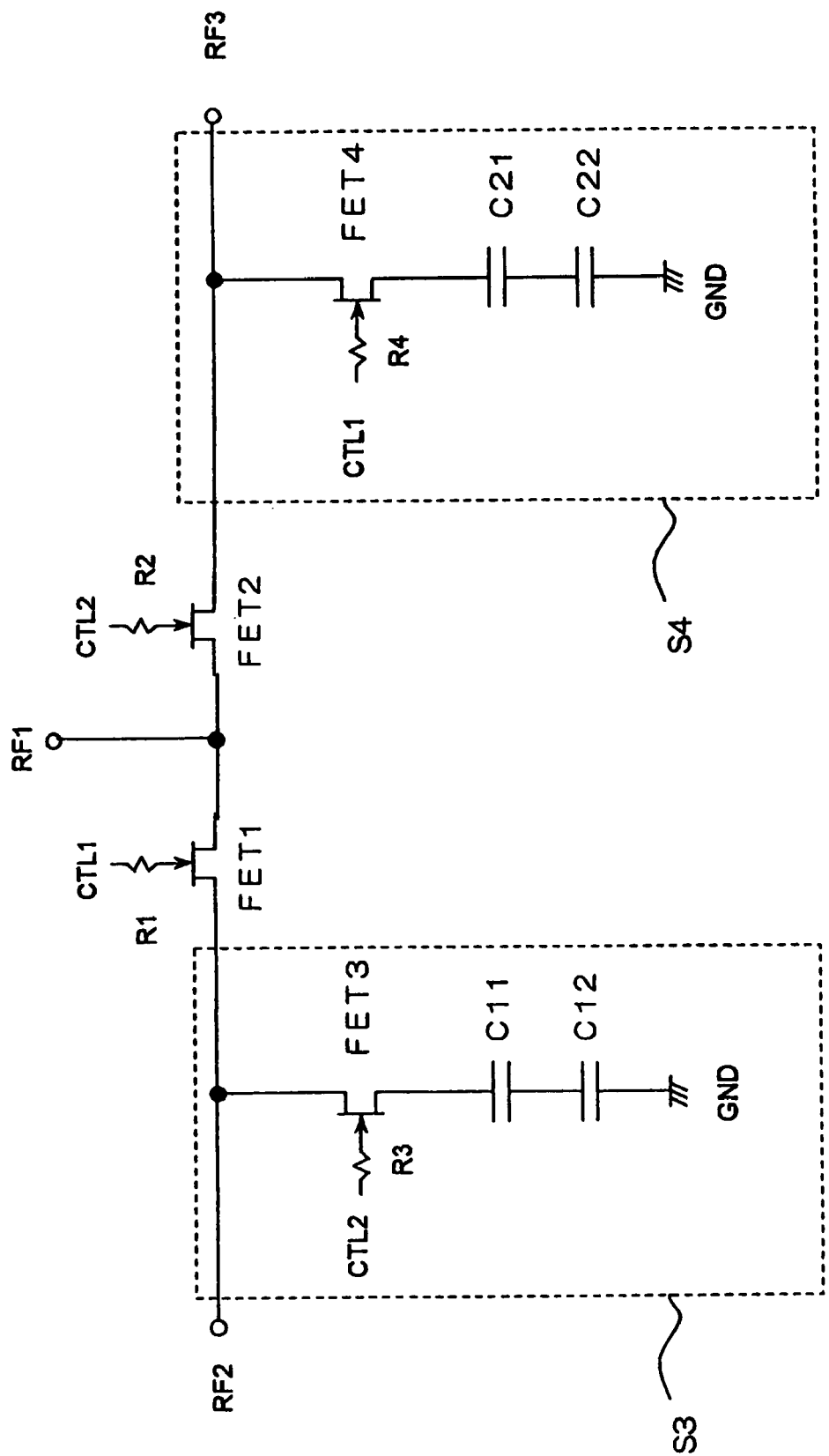
FIG. 1 is a circuit diagram to show the circuit configuration of a high-frequency switch circuit arrangement (SPDT switch) of a first embodiment of the invention.

FIG. 1 is a circuit diagram to show an example of a high-frequency switch circuit arrangement (high-frequency SPDT switch) according to a first embodiment of the invention.

In FIG. 1, a first signal terminal RF1 to a third signal terminal RF3, a first field effect transistor stage FET1 to a fourth field effect transistor stage FET4, and control signal inputs CTL1 and CTL2 are similar to those of the related art example.

In the embodiment, two stages of capacitative elements C11 and C12 as capacitative elements for cutting DC connected between the field effect transistor stage FET3 and a ground terminal GND contained in shunt circuit are connected in series, forming a shunt circuit S3. Likewise, two stages of capacitative elements C21 and C22 as capacitative elements for cutting DC connected between the field effect transistor stage FET4 and a ground terminal GND are connected, forming a shunt circuit S4.

Figure 8:
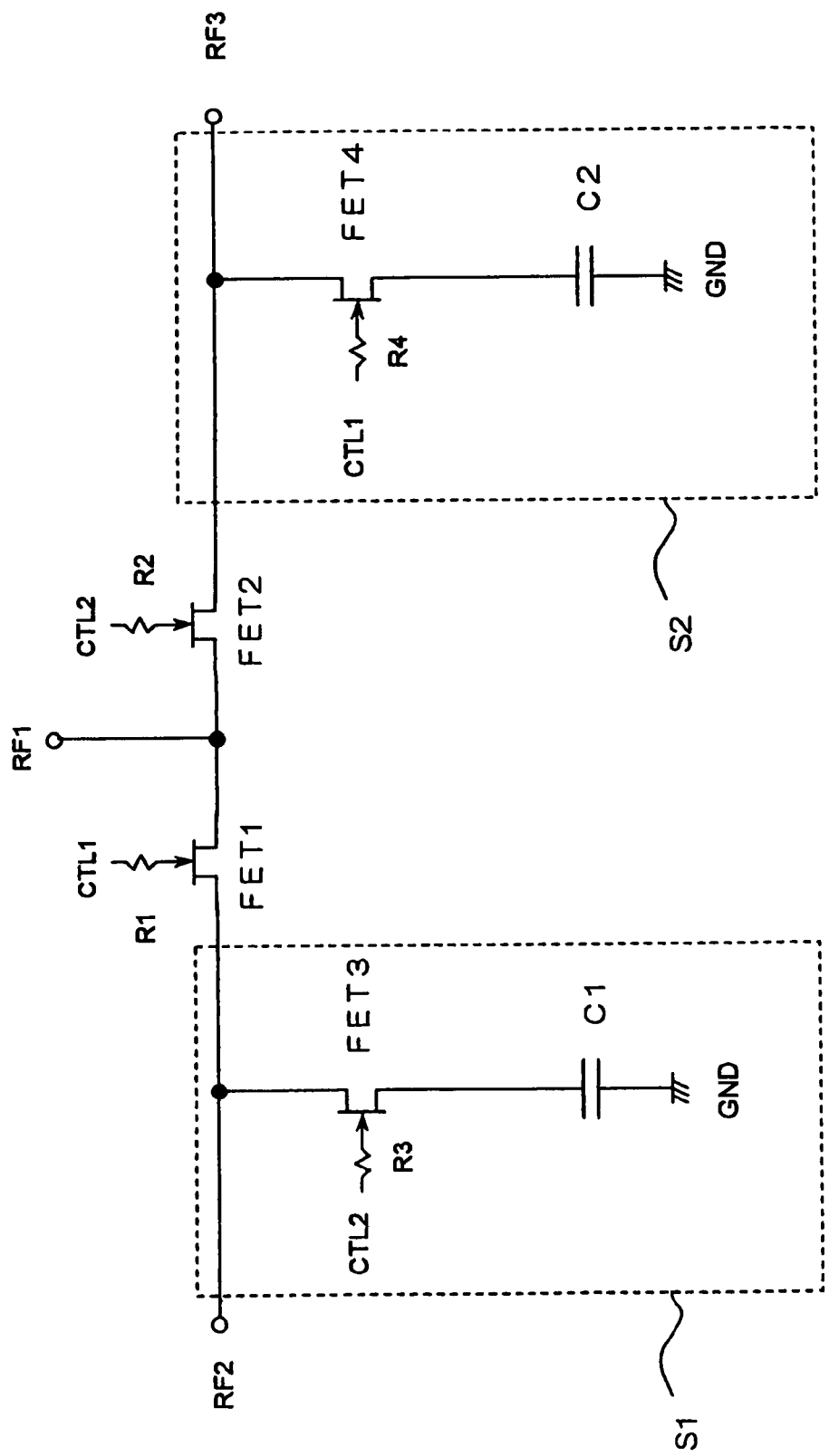
FIG. 8 is a circuit diagram to show the circuit configuration of a high-frequency switch circuit arrangement (SPDT switch) in a related art.

In the high-frequency switch circuit arrangement of the first embodiment, the capacitative elements for cutting DC in the shunt circuit are connected at two stages in series, so that if a surge is applied to each terminal of the high-frequency switch circuit arrangement, the voltage involved in one stage of capacitative element can be about halved as compared with the case where the capacitative element for cutting DC in the configuration in the related art shown in FIG. 8 is formed at one stage.

Particularly, if the capacitative elements are integrated as MMIC and the electrostatic breakdown voltage of the capacitative element is remarkably weak in the high-frequency switch circuit arrangement, the invention makes it possible to about double resistance to a surge as the whole high-frequency switch circuit.

Second Embodiment

Figure 2:
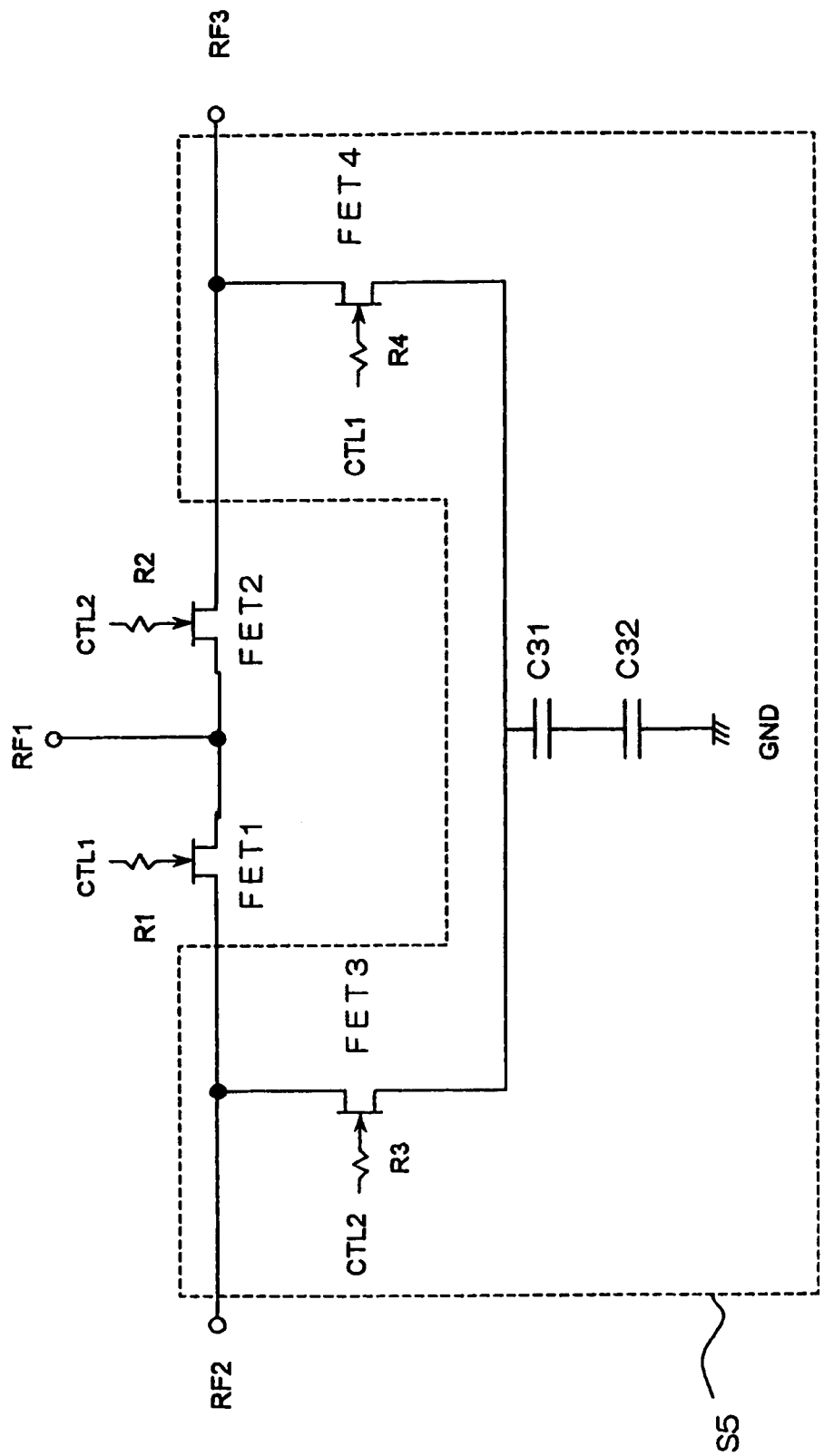
FIG. 2 is a circuit diagram to show the circuit configuration of a high-frequency switch circuit arrangement (SPDT switch) of a second embodiment of the invention.

FIG. 2 is a circuit diagram to show an example of a high-frequency switch circuit arrangement (high-frequency SPDT switch) according to a second embodiment of the invention.

In FIG. 2, a first signal terminal RF1 to a third signal terminal RF3, a first field effect transistor stage FET1 to a fourth field effect transistor stage FET4, and control signal inputs CTL1 and CTL2 are similar to those of the circuit of the first embodiment.

In the second embodiment, a connection point of connecting sources of the third field effect transistor stage FET3 and the fourth field effect transistor stage FET4 is provided and two stages of capacitative elements C31 and C32 as common capacitative elements for cutting DC are connected between the connection point and ground, forming a shunt circuit S5.

In the high-frequency switch circuit of the embodiment, the capacitative elements for cutting DC contained in the shunt circuit are formed at two stages in series as in the first embodiment, so that if the electrostatic breakdown voltage of the capacitative element is remarkably low in the high-frequency switch circuit, resistance to a surge as the whole high-frequency switch circuit can be about doubled.

Further, the capacitative elements in the shunt circuit are made common and thus the number of the capacitative elements in the circuit can be decreased and if the capacitative elements are integrated as MMIC, the occupation area of the capacitative elements can be reduced.

Figure 3:
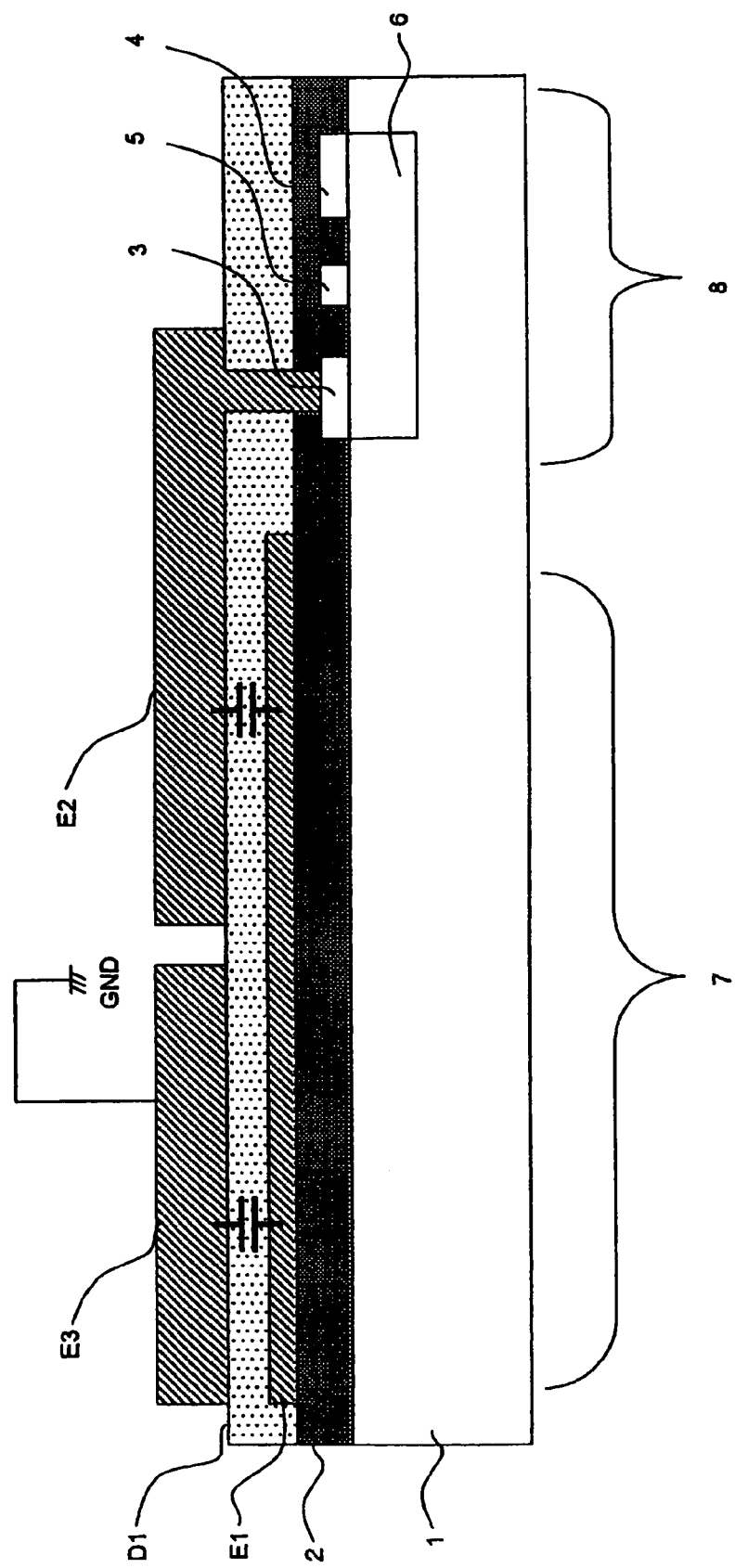
FIG. 3 is a sectional view to show an example of the structure of each of capacitative elements contained in the high-frequency switch circuit arrangements in FIGS. 1 and 2, on a semiconductor substrate.

FIG. 3 is a sectional view as an example when the two stages of the capacitative elements connected in series are manufactured on a GaAs substrate in the first or second embodiment of the invention.

As shown in FIG. 3, an insulating layer, a capacitor electrode E1 as a lower electrode of capacitative element, a dielectric layer D1, and capacitor electrodes E2 and E3 as upper electrode are deposited in order on a GaAs substrate 1, forming an MIM capacitor. The capacitor electrode E2 of the MIM capacitor is connected to the source of a field effect transistor stage forming a shunt circuit and the capacitor electrode E3 is connected to a ground terminal by wiring, whereby it is made possible to use them as the two stages of the capacitative elements in the first or second embodiment.

According to the configuration, when the capacitative elements are integrated as MMIC, if a plurality of capacitative elements exist, the lower electrode is made common and the two stages of the capacitative elements connected in series are formed as compared with the case where two stages of MIM capacitors each forming one stage of capacitative element are connected in series by drawing as contacts from the upper electrode and the lower electrode, so that the contract portion of drawing becomes unnecessary and thus the chip occupation area of the two stages of the capacitative elements connected to their respective paths can be furthermore reduced.

Third Embodiment

Figure 4:
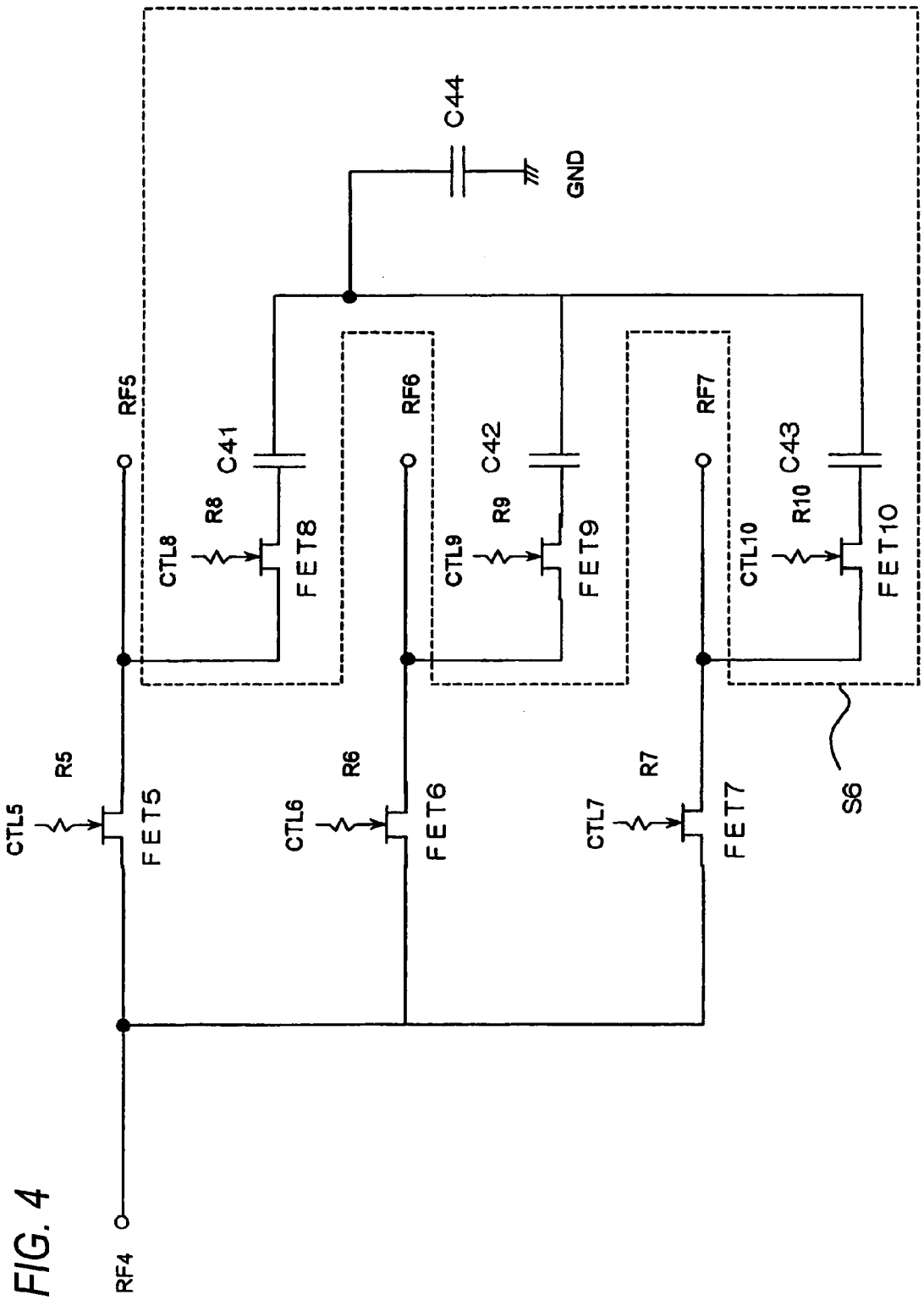
FIG. 4 is a circuit diagram to show the circuit configuration of a high-frequency switch circuit arrangement (SPDT switch) of a third embodiment of the invention.

FIG. 4 is a circuit diagram to show an example of a high-frequency switch circuit arrangement (high-frequency SP3T (Single-Pole Triple-Throw) switch) according to a third embodiment of the invention.

The high-frequency SP3T (Single-Pole Triple-Throw) switch switches the output path of an input high-frequency signal. A fourth signal terminal RF4 is placed on the input side and a fifth signal terminal RF5, a sixth signal terminal RF6, and a seventh signal terminal RF7 are placed on the output side. The high-frequency signal input through RF4 is output to one of RF5, RF6, and RF7 (the switch input/output may be made opposite).

A fifth field effect transistor stage FET5 of a switch element for switching the high-frequency signal path is provided between RF4 and RF5, a sixth field effect transistor stage FET6 is provided between RF4 and RF6, and a seventh field effect transistor stage FET7 is provided between RF4 and RF7.

Turning on/off the field effect transistor stages is controlled by fifth, sixth, and seventh control signal input terminals CTL5, CTL6, and CTL7, whereby the fourth signal terminal RF4 is electrically connected to one of RF5, RF6, and RF7.

To draw the signal leaking through the fifth field effect transistor stage FET5 when the fourth signal terminal RF4 and the fifth signal terminal RF5 are off into ground (GND), an eighth field effect transistor stage FET8 is placed between the fifth signal terminal RF5 and the ground terminal GND, a ninth field effect transistor stage FET9 is placed between the sixth signal terminal RF6 and the ground terminal GND, and a tenth field effect transistor stage FET10 is placed between the seventh signal terminal RF7 and the ground terminal GND, forming a shunt circuit S6.

Turning on/off the field effect transistor stages is controlled by the fifth control signal input terminal CTL5 to a tenth control signal input terminal CTL10. When CTL5 goes on, CTL9 and CTL10 go on, when CTL6 goes on, CTL8 and CTL10 go on, and when CTL7 goes on, CTL8 and CTL9 go on, whereby the isolation characteristic between the contacts is kept good.

In the embodiment, in the shunt circuit S6, as capacitative elements for cutting DC connected between the eighth field effect transistor stage FET8 and the ground terminal GND, between the ninth field effect transistor stage FET9 and the ground terminal GND, and between the tenth field effect transistor stage FET10 and the ground terminal GND, capacitative elements C41, C42, and C43 at one stage are connected in series to source electrodes of the eighth field effect transistor stage FET8 to the tenth field effect transistor stage FET10, and one stage of a common capacitative element G44 is connected in series between the capacitative elements C41, C42, and C43 and the ground.

According to the configuration, the capacitative elements for cutting DC contained in the shunt circuit S6 are formed at two stages in series, so that if the electrostatic breakdown voltage of the capacitative element is remarkably low in the high-frequency switch circuit, resistance to a surge as the whole high-frequency switch circuit can be improved about twice.

Further, as compared with the high-frequency switch circuit arrangement of the first embodiment, the capacitative element in the shunt circuit is made common at one stage and thus the number of the capacitative elements in the circuit can be decreased and if the capacitative elements are integrated as MMIC, the occupation area of the capacitative elements can be reduced.

As compared with the case where the two stages of the capacitative elements in series for cutting DC connected to the eighth field effect transistor stage FET8 to the tenth field effect transistor stage FET10 are all made common, for example, when RF4 and RF5 are connected, the source electrodes of the fifth field effect transistor stage FET5, the ninth field effect transistor stage FET9, and the tenth field effect transistor stage FET10 which are turned on are directly connected; in the embodiment, however, the connection point of off paths becomes the point through one stage of the capacitative element connected to the field effect transistor stages in the on state (in this case, the ninth field effect transistor stage FET9 and the tenth field effect transistor stage FET10).

If the two stages of the capacitative elements in series for cutting DC are all made common, there are two stages of capacitative elements in series to the ground and the impedance to the ground becomes high as compared with one stage and a situation wherein unnecessary high-frequency component is not sufficiently absorbed in the ground potential and leaks to another signal path in the off state is easily incurred.

Therefore, isolation between the sixth signal terminal RF6 and the seventh signal terminal RF7, namely, isolation degradation between off paths may occur; in the embodiment, however, only one stage of capacitative element exists in series between the connection point of off paths and the ground and thus the impedance to the ground becomes low and high-frequency component is sufficiently absorbed in the ground potential and therefore isolation degradation can be prevented.

Figure 5:
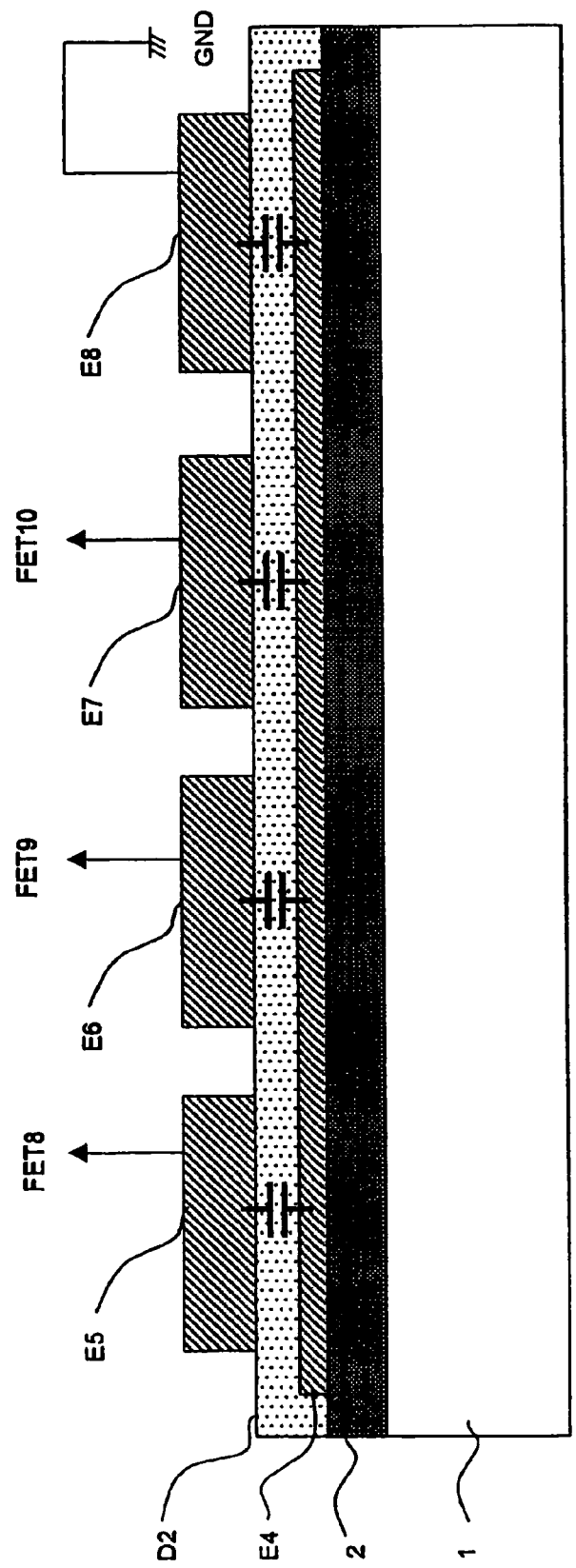
FIG. 5 is a sectional view to show an example of the structure of each of capacitative elements contained in the high-frequency switch circuit arrangement in FIG. 4, on a semiconductor substrate.
Figure 6:
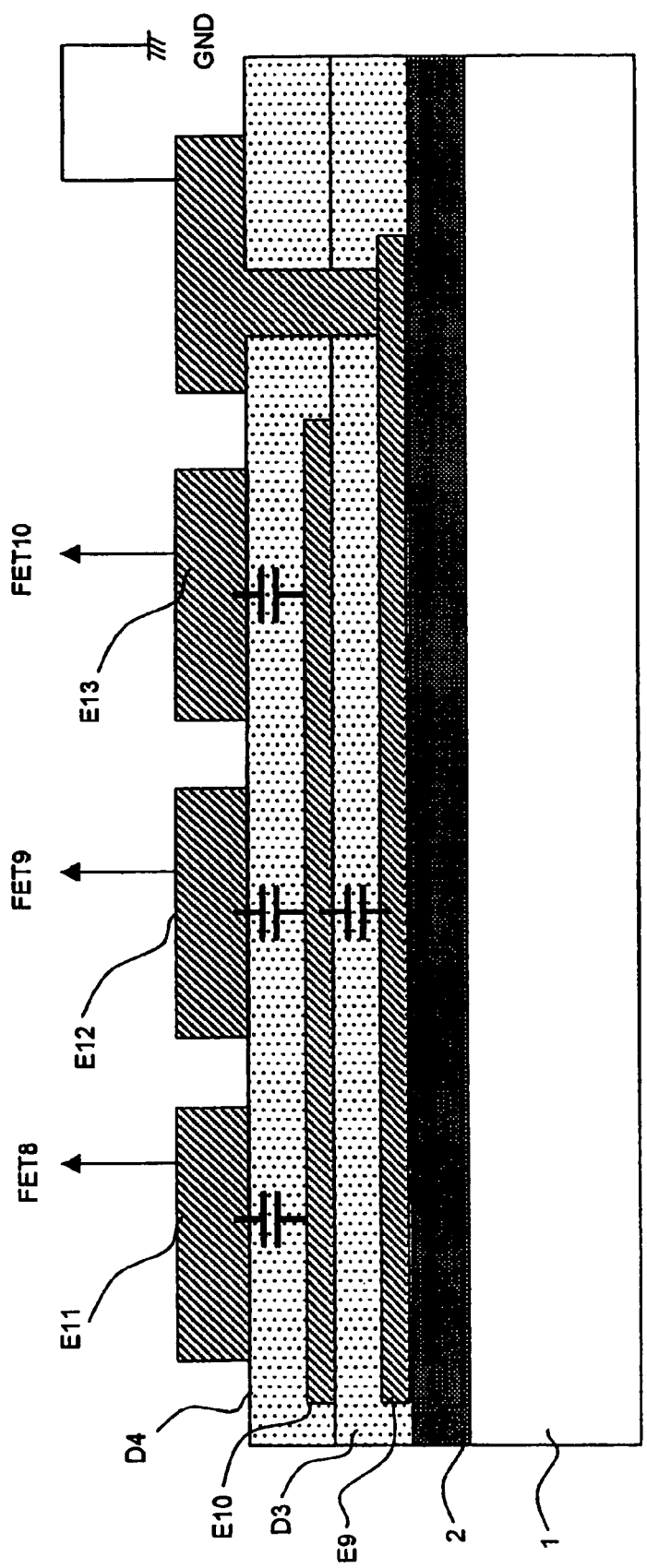
FIG. 6 is a sectional view to show another example of the structure of each of capacitative elements contained in the high-frequency switch circuit arrangement in FIG. 4, on a semiconductor substrate.
Figure 7:
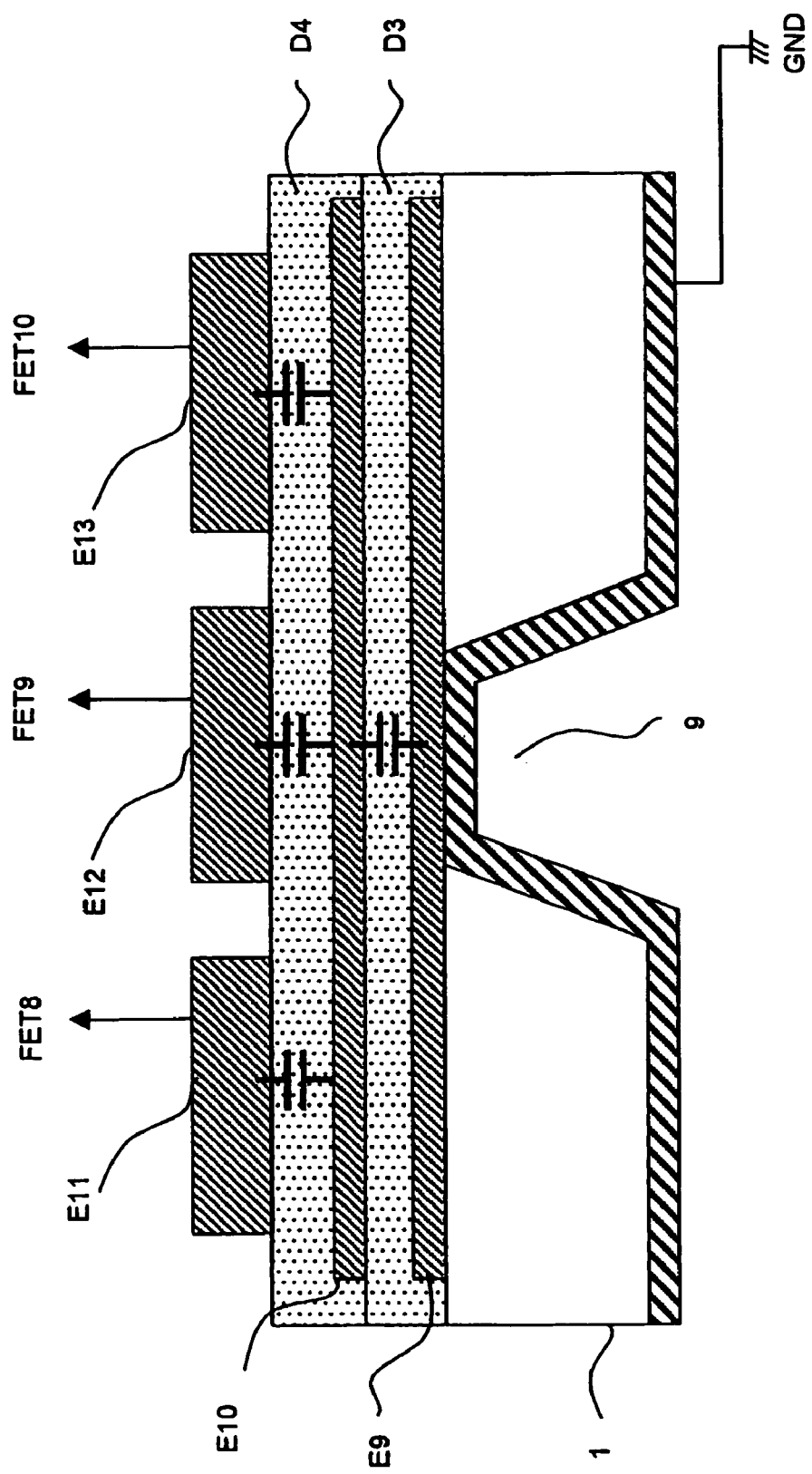
FIG. 7 is a sectional view to show another example of the structure of each of capacitative elements contained in the high-frequency switch circuit arrangement in FIG. 4, on a semiconductor substrate.

FIGS. 5, 6, and 7 are sectional views each as an example where the two stages of the capacitative elements connected in series are manufactured on a GaAs substrate in the third embodiment of the invention.

In the sectional view of capacitative element in FIG. 5, an insulating layer, a capacitor electrode E4 as a lower electrode of capacitative element, a dielectric layer D2, and capacitor electrodes E5, E6, E7, and E8 as upper electrode are deposited in order on a GaAs substrate 1, forming an MIM capacitor.

The capacitor electrode E5 of the MIM capacitor is connected to the source of the eighth field effect transistor stage FET8 forming shunt circuit, the capacitor electrode E6 is connected to the source of the ninth field effect transistor stage FET9 forming shunt circuit, the capacitor electrode E7 is connected to the source of the tenth field effect transistor stage FET10 forming shunt circuit, and the capacitor electrode E8 is connected to a ground terminal by wiring, whereby it is made possible to use them as the two stages of the capacitative elements in the third embodiment.

According to the configuration, when the capacitative elements are integrated as MMIC, if a plurality of capacitative elements exist, the lower electrode is made common and the two stages of the capacitative elements connected in series are formed as compared with the case where two stages of MIM capacitors each forming one stage of capacitative element are connected in series by drawing as contacts from the upper electrode and the lower electrode, so that the contract portion of drawing becomes unnecessary and thus the chip occupation area of the two stages of the capacitative elements connected to their respective paths can be manufactured small.

Next, in the sectional view of capacitative element in FIG. 6, an insulating layer, a first capacitor electrode E9 of capacitative element, a first dielectric layer D3, a second capacitor electrode E10, a second dielectric layer D4, and third capacitor electrodes E11, E12, and E13 are deposited in order on a GaAs substrate 1, forming an MIMIM capacitor. That is, the capacitative element is formed using a multilayer interconnection technique.

The capacitor electrode E11 of the MIMIM capacitor is connected to the source of the eighth field effect transistor stage FET8 forming shunt circuit, the capacitor electrode E12 is connected to the source of the ninth field effect transistor stage FET9 forming shunt circuit, the capacitor electrode E13 is connected to the source of the tenth field effect transistor stage FET10 forming shunt circuit, and the capacitor electrode E9 is drawn by contacts and is connected to a ground terminal by wiring, whereby it is made possible to use them as the two stages of the capacitative elements in the third embodiment.

According to the configuration, if a plurality of capacitative elements exist, one stage of the capacitative element connected in series to each field effect transistor stage of the shunt circuit is formed with a lower electrode made common and the lower electrode is used as an upper electrode of one stage of common capacitative element to the ground to form MIMIM, so that the two stages of the capacitative elements in series of the high-frequency switch circuit arrangement of the third embodiment can be manufactured with a small occupation area.

One stage of common capacitative element to the ground can be manufactured without changing the capacitative element occupation area of the whole shunt circuit and the area (capacitance value) of one stage of the capacitative element connected in series to the source electrode of each field effect transistor stage of the shunt circuit S6 can be doubled or more, so that it is easily made possible to furthermore lessen the impedance between the connection point of off paths of the shunt circuit S6 and the ground.

Accordingly, isolation degradation prevention between the off paths, the advantage of the high-frequency switch circuit arrangement of the third embodiment, can be made furthermore effective.

Next, in the sectional view of capacitative element in FIG. 7, a first capacitor electrode E9 of capacitative element, a first dielectric layer D3, a second capacitor electrode E10, a second dielectric layer D4, and third capacitor electrodes E11, E12, and E13 are deposited in order on a GaAs substrate 1, forming an MIMIM capacitor.

The capacitor electrode E11 of the MIMIM capacitor is connected to the source of the eighth field effect transistor stage FET8 forming shunt circuit, the capacitor electrode E12 is connected to the source of the ninth field effect transistor stage FET9 forming shunt circuit, the capacitor electrode E13 is connected to the source of the tenth field effect transistor stage FET10 forming shunt circuit, and the capacitor electrode E9 is connected to a ground terminal by a via hole, whereby it is made possible to use them as the two stages of the capacitative elements in the third embodiment.

According to the configuration, in the two stages of the capacitative elements in series of the high-frequency switch circuit arrangement of the third embodiment, for the common capacitative element connected to the ground in the shunt circuit, inductance component of wire bonding, etc., added between the capacitative element and the ground can be eliminated and the impedance to the ground can be furthermore lessened.

That is, isolation degradation prevention between the off paths, the advantage of the high-frequency switch circuit arrangement of the third embodiment, can be made furthermore effective.

(Other Modifications)
(1) The one-input two-output switch (SPDT switch) is formed as the high-frequency switch circuit arrangement in the first, second embodiment and the one input three-output switch (SP3T switch) is formed in the third embodiment, but the numbers of the input terminals and the output terminals of the high-frequency switch circuit arrangement are not limited to them.

If the high-frequency switch circuit arrangement is multiple input and multiple output, a similar advantage can be provided and the high-frequency switch circuit arrangement involving two stages of capacitative elements for cutting DC in the shunt circuit is also contained in the invention, of course.

(2) In the embodiments described above, the field effect transistor stage of the switch circuit provided in each high-frequency signal path is formed of one FET, but the configuration of the field effect transistor stage is not limited to it. The case where the field effect transistor stage is made up of FETs connected in series or the case where the field effect transistor stage is a multigate field effect transistor is also contained in the invention, of course.

(3) In the embodiments described above, the sources of the field effect transistor stage of the switch circuit provided in each high-frequency signal path are represented separately from drains, but the source and the drain are symmetric in the switch element and the case where the source and the drain are replaced is also contained in the invention, of course.

(4) The invention may be embodied using the embodiments described above and the modifications described above in combination.

As described above, according to the invention, the capacitative elements of the components of a shunt path of a high-frequency component are connected in series at least at two stages, whereby if a surge voltage is applied, the voltage that each capacitative element should bear decreases in inverse proportion to the number of the connection stages and consequently the surge resistance of the capacitative element can be increased in proportion to the number of the connection stages.

If capacitative elements are integrated as MMIC, the insulating film is thin and thus the electrostatic breakdown resistance amount is low. However, according to the invention, the electrostatic breakdown resistance amount can be effectively increased without changing the manufacturing process and without adding an extra protective element. Accordingly, the reliability of the high-frequency switch circuit arrangement is improved.

The capacitative elements used with the shunt circuit are made common, whereby the number of elements reduces and the capacitative element occupation area when the capacitative elements are put into MMIC can be decreased. In an integrated circuit, the capacitative element tends to occupy a large area, which is one factor of hindering miniaturization of the chip size. Thus, the merit in decreasing the number of the capacitative elements is large.

Capacitative elements put into MMIC can be manufactured reasonably and efficiently using the usual manufacturing process technology of compound semiconductor ICs. The electrodes are made common, whereby the need for the drawing contact part is eliminated and the occupation area can be reduced.

Only the capacitative element on the ground potential side is made common, whereby such a situation wherein the high-frequency signal component flowing from one shunt path toward the ground potential is not absorbed in the ground potential and is routed to the shunt circuit relative to another off signal path is prevented more effectively and the degradation prevention effect of isolation between the shunt circuits relative to off signal paths is enhanced.

Using the multilayer interconnection technique, the capacitative element required for a shunt circuit can be formed efficiently and compactly.

The structure wherein the capacitor electrode is connected to the ground potential through a via hole is adopted, whereby the fear of adding the inductance component caused by bonding wire, etc., is eliminated and AC impedance is furthermore lessened and therefore the addition prevention effect of isolation between the shunt circuits relative to off signal paths can be furthermore enhanced.

The high-frequency switch circuit arrangement of the invention is appropriately put into MMIC and is small-sized and has high surge resistance, so that it can also be installed in a mobile communication terminal used in various environments with safety without any problems.

The invention provides the advantage that the electrostatic breakdown resistance amount of the high-frequency switch circuit arrangement can be effectively increased without changing the manufacturing process and without adding an extra protective element and therefore is useful as a high-frequency switch circuit arrangement installed in a compact and lightweight mobile communication terminal, for example.

What is claimed is:

1. A high-frequency switch circuit arrangement, comprising:
    an input terminal, inputting a high-frequency signal;
    an output terminal, outputting the input high-frequency signal;
    a first field effect transistor, being connected between the input terminal and the output terminal;
    a second field effect transistor, having a drain connected to the input terminal so as to enter a conduction state when the first field effect transistor is in a non-conduction state; and
    first and second capacitative elements being connected in series between a source of the second field effect transistor and a ground terminal;
    wherein the first and second capacitative elements are implemented as an MIM (metal insulator metal) capacitor comprising a lower electrode created on a semiconductor substrate and first and second upper electrodes formed apart on a dielectric layer via the dielectric layer formed on the lower electrode,
    the source of the second field effect transistor is connected to the first upper electrode,
    the second upper electrode is connected to the ground terminal, and
    the first capacitative element formed between the first upper electrode and the lower electrode and the second capacitative element formed between the lower electrode and the second upper electrode make up the first and second capacitative elements connected in series.

2. A high-frequency switch circuit arrangement, comprising:
   first to third input/output terminals;
   a first field effect transistor, intervening in a first signal path connecting the first input/output terminal and the second input/output terminal;
   a second field effect transistor, having a drain connected to a signal path between the first field effect transistor and the second input/output terminal, the second field effect transistor being turned on when the first field effect transistor is off;
   a third field effect transistor, intervening in a second signal path connecting the first input/output terminal and the third input/output terminal;
   a fourth field effect transistor, having a drain connected to a signal path between the first field effect transistor and the third input/output terminal, the fourth field effect transistor being turned on when the third field effect transistor is off;
   first and second capacitative elements, being connected in series between a source of the second field effect transistor and a ground potential; and
   third and fourth capacitative elements being connected in series between a source of the fourth field effect transistor and the around potential,
   wherein the first and second capacitative elements are implemented as an MIM (metal insulator metal) capacitor comprising a lower electrode created on a semiconductor substrate and first and second upper electrodes formed apart on a dielectric layer via the dielectric layer formed on the lower electrode,
   the source of the second field effect transistor is connected to the first upper electrode,
   the second upper electrode is connected to the ground terminal, and
   the first capacitative element formed between the first upper electrode and the lower electrode and the second capacitative element formed between the lower electrode and the second upper electrode make up the first and second stages of capacitative elements connected in series.

3. A high-frequency switch circuit arrangement, comprising:
   first to third input/output terminals;
   a first field effect transistor, intervening in a first signal path connecting the first input/output terminal and the second input/output terminal;
   a second field effect transistor, having a drain connected to a signal path between the first field effect transistor and the second input/output terminal, the second field effect transistor being turned on when the first field effect transistor is off;
   a third field effect transistor, intervening in a second signal path connecting the first input/output terminal and the third input/output terminal;
   a fourth field effect transistor, having a drain connected to a signal path between the first field effect transistor and the third input/output terminal, the fourth field effect transistor being turned on when the third field effect transistor is off;
   first and second capacitative elements, being connected in series between a source of the second field effect transistor and a around potential;
   third and fourth capacitative elements being connected in series between a source of the fourth field effect transistor and the ground potential;
   a connection point of connecting the sources of the second and fourth field effect transistors,
   wherein the first and second capacitative elements and the third and fourth capacitative elements are common, and the first and second capacitative elements comprise a first stage of capacitative element being connected in series to the sources of the second and fourth field effect transistors and a common capacitative element connected in series between the first stage of capacitative element and a ground terminal, and
   wherein the first to third capacitative elements are implemented as an MIM capacitor formed on a semiconductor substrate, and
   the MIM capacitor comprises a common lower electrode formed on the semiconductor substrate, a dielectric layer formed on the common lower electrode, and first to third upper electrodes formed apart each other on the dielectric layer and has a structure wherein the sources of the field effect transistors are connected to the first and second upper electrodes and the third upper electrode is connected to the ground potential, wherein the common lower electrode, the dielectric layer, and the first upper electrode form the first capacitative element, the common lower electrode, the dielectric layer, and the second upper electrode form the second capacitative element, and the common lower electrode, the dielectric layer, and the third upper electrode form the third capacitative element.

4. A high-frequency switch circuit arrangement, comprising:
   first to third input/output terminals;
   a first field effect transistor, intervening in a first signal path connecting the first input/output terminal and the second input/output terminal;
   a second field effect transistor, having a drain connected to a signal path between the first field effect transistor and the second input/output terminal, the second field effect transistor being turned on when the first field effect transistor is off;
   a third field effect transistor, intervening in a second signal path connecting the first input/output terminal and the third input/output terminal;
   a fourth field effect transistor, having a drain connected to a signal path between the first field effect transistor and the third input/output terminal, the fourth field effect transistor being turned on when the third field effect transistor is off;
   first and second capacitative elements, being connected in series between a source of the second field effect transistor and a ground potential;
   third and fourth capacitative elements being connected in series between a source of the fourth field effect transistor and the ground potential;
   a connection point of connecting the sources of the second and fourth field effect transistors
   wherein the first and second capacitative elements and the third and fourth capacitative elements are common, and the first and second capacitative elements comprise a first stage of capacitative element being connected in series to the sources of the second and fourth field effect transistors and a common capacitative element connected in series between the first stage of capacitative element and a ground terminal, and
   wherein the first to third capacitative elements are implemented as an MIM (Metal Insulator Metal) capacitor formed on a semiconductor substrate, the MIM capacitor comprises a first capacitor electrode formed on the semiconductor substrate, a first dielectric layer provided on the first capacitor electrode, a second common capacitor electrode provided on the first dielectric layer, a second dielectric layer formed on the second common capacitor electrode, and third and fourth capacitor electrodes formed apart each other on the second dielectric layer and has a structure wherein the sources of the field effect transistors are connected to the third and fourth capacitor electrodes and the first capacitor electrode is connected to the ground potential, and the third and fourth capacitor electrodes, the second dielectric layer, and the second common capacitor electrode form the first and second capacitative elements, and the first capacitor electrode, the first dielectric layer, and the second common capacitor electrode form the third capacitative element.

5. A high-frequency switch circuit arrangement, comprising:

first to third input/output terminals;

a first field effect transistor, intervening in a first signal path connecting the first input/output terminal and the second input/output terminal;

a second field effect transistor, having a drain connected to a signal path between the first field effect transistor and the second input/output terminal, the second field effect transistor being turned on when the first field effect transistor is off;

a third field effect transistor, intervening in a second signal path connecting the first input/output terminal and the third input/output terminal;

a fourth field effect transistor, having a drain connected to a signal path between the first field effect transistor and the third input/output terminal, the fourth field effect transistor being turned on when the third field effect transistor is off;

first and second capacitative elements, being connected in series between a source of the second field effect transistor and a ground potential;

third and fourth capacitative elements being connected in series between a source of the fourth field effect transistor and the ground potential;

a connection point of connecting the sources of the second and fourth field effect transistors, wherein the first and second capacitative elements and the third and fourth capacitative elements are common, and the first and second capacitative elements comprise a first stage of capacitative element being connected in series to the sources of the second and fourth field effect transistors and a common capacitative element connected in series between the first stage of capacitative element and a ground terminal, and wherein the semiconductor substrate is formed with a via hole and a ground electrode covering the inner surface of the via hole and connected to the ground potential is formed and the ground electrode and the first capacitor electrode are connected through the via hole.

* * * * *